US 6,548,853 B1

(12) United States Patent
Hwang et al.

(10) Patent No.: US 6,548,853 B1
(45) Date of Patent: Apr. 15, 2003

(54) CYLINDRICAL CAPACITORS HAVING A STEPPED SIDEWALL AND METHODS FOR FABRICATING THE SAME

(75) Inventors: In-Seak Hwang, Kyunggi-do (KR); Si-Youn Kim, Seoul (KR); Yoo-Sang Hwang, Kyunggi-do (KR); Hoon Jung, Kyunggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/076,234

(22) Filed: Feb. 13, 2002

(51) Int. Cl.$^7$ .............................. H01L 27/108
(52) U.S. Cl. ..................... 257/306; 257/307; 257/308; 257/309; 361/303; 361/306.1; 361/306.3
(58) Field of Search ................. 257/306, 307, 257/308, 309; 361/303, 306.1, 306.3

(56) References Cited

U.S. PATENT DOCUMENTS 6,011,286 A * 1/2000 Wu ............................ 257/309
6,222,722 B1 * 4/2001 Fukuzumi et al. .......... 361/305

FOREIGN PATENT DOCUMENTS

JP          2001-60673        * 3/2001

* cited by examiner

Primary Examiner—Minh Loan Tran
Assistant Examiner—Tan Tran
(74) Attorney, Agent, or Firm—Marger Johnson & McCollom, P.C.

(57) ABSTRACT

Cylindrical capacitors and methods of fabricating the same are provided. The cylindrical capacitor includes a cylindrical storage node stacked on a semiconductor substrate. The cylindrical storage node has a base and a stepped sidewall located on the base. The stepped sidewall has at least two sub-sidewalls, which are sequentially stacked, and at least one joint portion that connects a lower sidewall of the sub-sidewalls to an upper sidewall stacked on the lower sidewall. An upper diameter of the respective sub-sidewalls is greater than a lower diameter thereof. Also, the upper diameter of the lower sidewall is greater than the lower diameter of the upper sidewall stacked on the lower sidewall. The method of fabricating the cylindrical storage node having a stepped sidewall includes sequentially forming a plurality of molding layers over a semiconductor substrate. An etch rate of a lower molding layer of the plurality of molding layers being faster than that of an upper molding layer on the lower molding layer with respect to a predetermined etchant. The plurality of molding layers are patterned to form a preliminary storage node hole that exposes a portion of the semiconductor substrate. The patterned molding layers are isotropically etched using the etchant, thereby forming a storage node hole. Therefore, the storage node hole has a stepped sidewall profile. A conformal conductive layer is then formed on the substrate and the conductive layer is planarized until a top surface of the molding layers is exposed.

3 Claims, 9 Drawing Sheets

CYLINDRICAL CAPACITORS HAVING A STEPPED SIDEWALL AND METHODS FOR FABRICATING THE SAME

BACKGROUND OF THE INVENTION

1. Field of the Invention

The present invention relates to semiconductor devices and methods of fabricating the same and, more particularly, to cylindrical capacitors having a stepped sidewall and methods for fabricating the same.

2. Description of the Related Art

With continuing efforts to increase integration density, semiconductor integrated circuit devices become smaller and are spaced to each other more closely than ever. Accordingly, cell capacitors of a highly integrated dynamic random access memory (DRAM) become smaller and smaller. When the cell capacitance is reduced, memory cells can suffer from soft error due to alpha particles and can easily lose their stored data. Thus, the cell capacitance of the highly integrated DRAM should be increased to improve cell characteristics such as soft error.

Along this line, three-dimensional cell capacitors, e.g., cylindrical capacitors are widely employed in the highly integrated DRAM to increase the cell capacitance.

FIG. 1 is a cross sectional view showing conventional cylindrical capacitors.

Referring to FIG. 1, an interlayer insulating layer 110 is formed on a semiconductor substrate (not shown). The interlayer insulating layer 110 is patterned to form a plurality of storage node contact holes in the interlayer insulating layer 110. Each of the storage node contact holes is filled with a storage node contact plug 112. An etch stopping layer 114 and a molding layer (not shown) are sequentially formed on an entire surface of the substrate having the storage node contact plugs 112. The molding layer and the etch stopping layer 114 are successively etched to form a plurality of storage node holes that expose the respective storage node contact plugs 112. In this case, the storage node holes have sloped sidewalls. In particular, the thicker the molding layer is, the more sluggish the slope of the sidewall is. Cylindrical storage nodes 116 are then formed in the storage node contact holes. Thus, the sidewalls of the storage nodes 116 are also inclined along the sidewalls of the storage node contact holes as shown in FIG. 1. As a result, it is difficult to increase surface areas of the cylindrical storage nodes 116 at the base thereof.

SUMMARY OF THE INVENTION

The present invention provides methods for fabricating a cylindrical capacitor with a storage node having a stepped sidewall to increase capacitance.

Another feature of the present invention is to provide cylindrical capacitors including a storage node that has an increased surface area.

According to an aspect of the present invention, the cylindrical capacitor includes a semiconductor substrate and a cylindrical storage node stacked on the semiconductor substrate. The storage node has a base and a stepped sidewall on the base. The stepped sidewall has at least two sub-sidewalls, which are sequentially stacked, and at least one joint portion that connects a lower sidewall of the two sub-sidewalls to an upper sidewall on the lower sidewall. Here, an upper diameter of the respective sub-sidewalls is greater than a lower diameter thereof. Also, an upper diameter of the lower sidewall is greater than a lower diameter of the upper sidewall. Accordingly, a step is formed between the two sub-sidewalls, which are adjacent to each other.

In addition, an interlayer insulating layer may be interposed between the cylindrical storage node and the semiconductor substrate. The cylindrical storage node is electrically connected to the semiconductor substrate via a storage node contact plug formed within a storage node contact hole that penetrates a portion of the interlayer insulating layer.

According to another aspect of the invention, the invention is directed to a method for fabricating a cylindrical capacitor. The method includes providing a semiconductor substrate. A plurality of molding layers are sequentially formed over the semiconductor substrate. An etch rate of a lower molding layer of the plurality of molding layers is faster than that of an upper molding layer on the lower molding layer with respect to a predetermined etchant such as an oxide etchant. The plurality of molding layers are patterned to form a preliminary storage node hole that exposes a portion of the semiconductor substrate. The molding layers are isotropically etched using the etchant to form a storage node hole. Accordingly, the storage node hole has a stepped sidewall profile. A cylindrical storage node is then formed in the storage node hole. A sidewall of the storage node is conformably formed along the stepped sidewall profile of the storage node hole. Hence, the cylindrical storage node has a stepped sidewall.

Preferably, a thickness of the lower molding layer is less than that of the upper molding layer on the lower molding layer.

In addition, the molding layers are preferably a borophosphosilicate glass (BPSG) layer and an undoped silicate glass (USG).

Further, an interlayer insulating layer may be formed on the semiconductor substrate prior to formation of the plurality of molding layers. In this case, the interlayer insulating layer is patterned to form a storage node contact hole that exposes a portion of the semiconductor substrate, and a storage node contact plug is formed within the storage node contact hole. Also, the storage node hole is formed to expose the storage node contact plug. Accordingly, the storage node is electrically connected to the semiconductor substrate via the storage node contact plug.

DESCRIPTION OF THE PREFERRED EMBODIMENT

Figure 1:
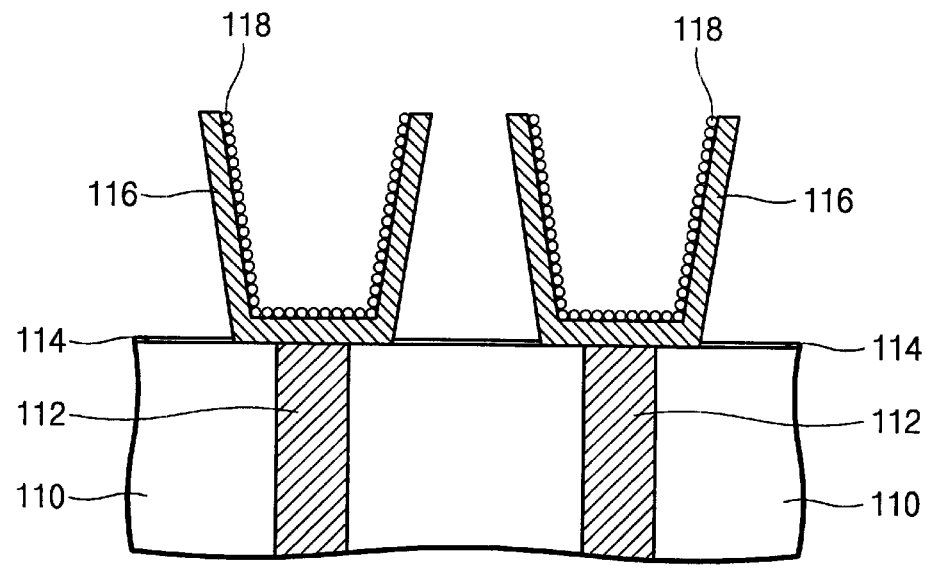
FIG. 1 is a cross sectional view for illustrating a conventional method for fabricating a cylindrical capacitor.
Figure 2A:
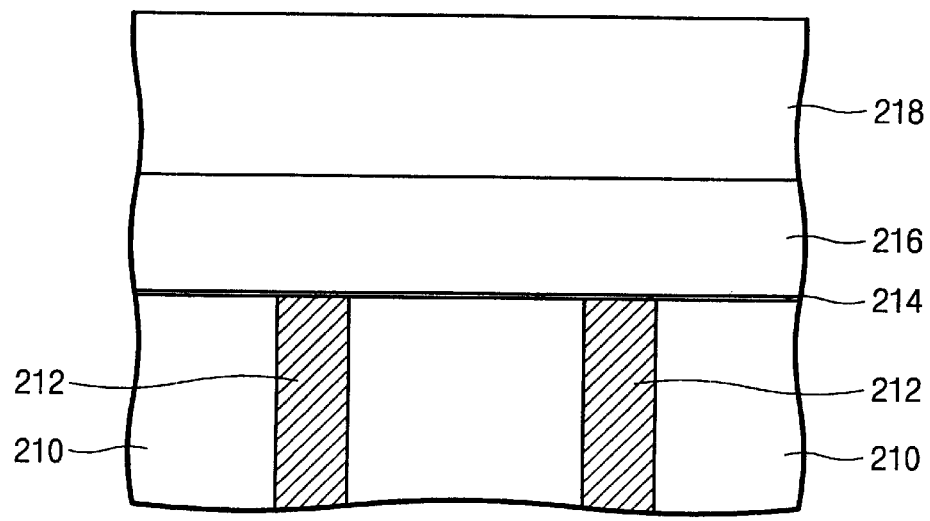
FIGS. 2A through 2E are cross sectional views that illustrate methods for fabricating cylindrical capacitors according to an embodiment of the invention and cylindrical capacitors fabricated.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate or intervening layers may also be present. Referring to FIG. 2A, an interlayer insulating layer 210 is formed on a semiconductor substrate (not shown). The interlayer insulating layer 210 is patterned to form a plurality of storage node contact holes therein to expose predetermined regions of the semiconductor substrate. Storage node contact plugs 212 are then formed in the storage node contact holes, using conventional techniques. An etch stopping layer 214 is formed on the substrate having the storage node contact plugs 212. Subsequently, a lower molding layer 216 and an upper molding layer 218 are sequentially formed on the etch stopping layer 214. The upper molding layer 218 is preferably formed to be thicker than the lower molding layer 216. The lower molding layer 216 is formed of a material that has an etch rate that is faster than that of the upper molding layer 218. For example, the lower molding layer 216 is preferably formed of oxide containing impurities such as boron and/or phosphorus, and the upper molding layer 218 is preferably formed of oxide that does not contain the impurities. Specifically, the lower molding layer 216 may be formed of borophosphosilicate glass (BPSG) or phosphosilicate glass (PSG), and the upper molding layer 218 may be formed of undoped silicate glass (USG), tetraethylorthosilicate (TEOS) or high density plasma (HDP) oxide. In this case, etch rates of the BPSG and the PSG is faster than those of the USG, the TEOS and the HDP oxide with respect to an oxide etchant such as hydrofluoric acid (HF solution). In addition, the etch rates of the BPSG and the PSG is also faster than those of the USG, the TEOS and the HDP oxide with respect to another etchant such as a mixture of ammonium hydroxide ($NH_4OH$), hydrogen peroxide ($H_2O_2$) and de-ionized water.

The etch stopping layer 214 is preferably formed of an insulating material that has an etch selectivity with respect to the material for the molding layers 216 and 218. For example, the etch stopping layer 214 may be formed of silicon nitride.

Figure 2B:
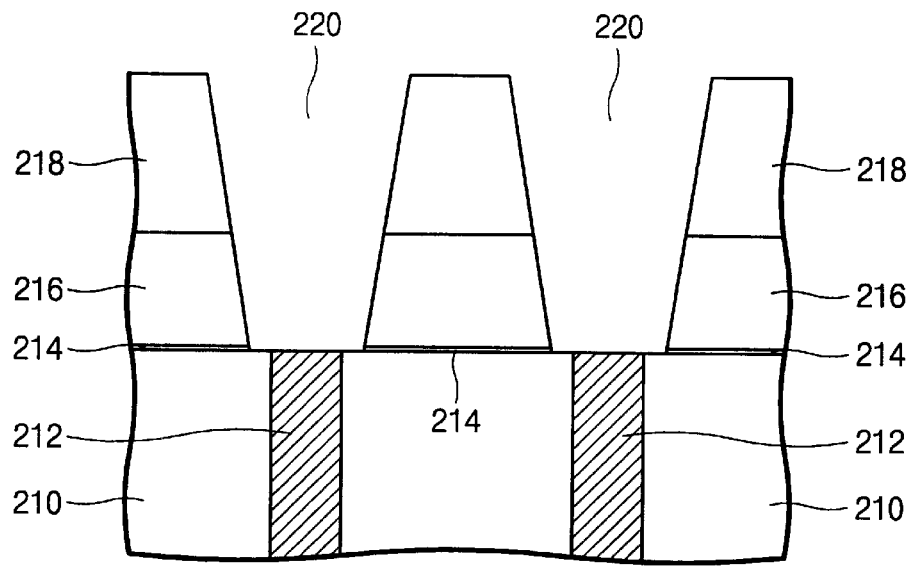

Referring to FIG. 2B, the upper molding layer 218, the lower molding layer 216 and the etch stop layer 214 are successively patterned to form preliminary storage node holes 220 that expose the storage node contact plugs 212. The upper molding layer 218, the lower molding layer 216 and the etch stopping layer 214 are etched, preferably, using an anisotropic etching technique such as a dry etching technique. In this case, each of the preliminary storage node holes 220 has a sloped sidewall profile as shown in FIG. 2B. In other words, an upper diameter of the respective preliminary storage node holes 220 is greater than a lower diameter thereof. Thus, the sidewalls of the preliminary storage node holes 220 have a positive slope.

Figure 2C:
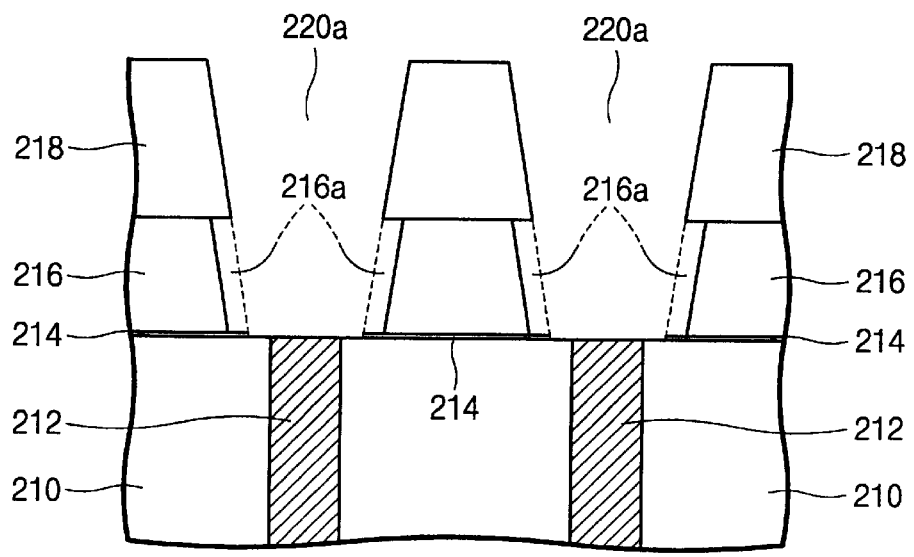

Referring to FIG. 2C, the lower and upper molding layers 216 and 218 are isotropically etched using an HF solution and/or the mixture described above to form storage node holes 220a. Therefore, the lower molding layer 216 is laterally etched to form undercut regions 216a below lower edges of the upper molding layer 218. As a result, lower regions of the storage node holes 220 are enlarged to form a step between the lower molding layer 216 and the upper molding layer 218 in the storage node holes 220a. The mixture is widely used in a surface cleaning process for removing a native oxide layer and polymers that exist on the surface of the substrate where the etching process is completed. Thus, the mixture may act as a cleaning solution as well as an etchant.

Figure 2D:
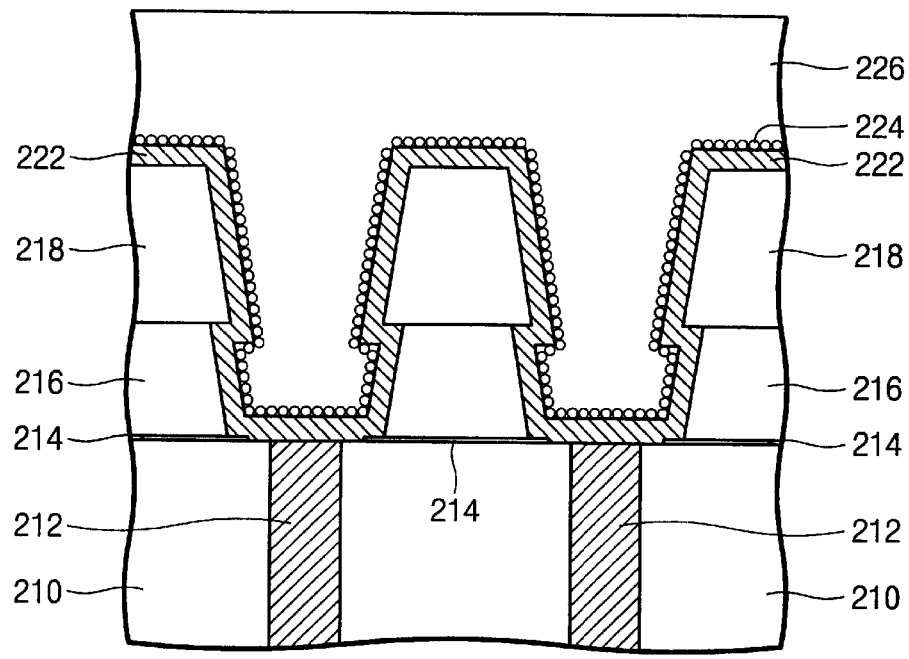

Referring to FIG. 2D, a conformal conductive layer 222 is formed on the upper and lower molding layers 216, 218 and within the storage node holes 220. The conformal conductive layer 222 may be a doped polysilicon layer or a doped amorphous silicon layer. Thus, the conductive layer 222 on the sidewalls of the storage node holes 220 is formed to have the same profile as the sidewalls of the storage node holes 220. Furthermore, a hemispherical grain (HSG) silicon layer 224 can be formed on the conductive layer 222, using conventional techniques. A sacrificial layer 226 is then formed on the surface of the substrate having the HSG silicon layer 224. The sacrificial layer 226 is preferably formed of the same material layer as the molding layers 216 and 218. Specifically, the sacrificial layer 226 is preferably formed of silicon oxide.

Figure 2E:
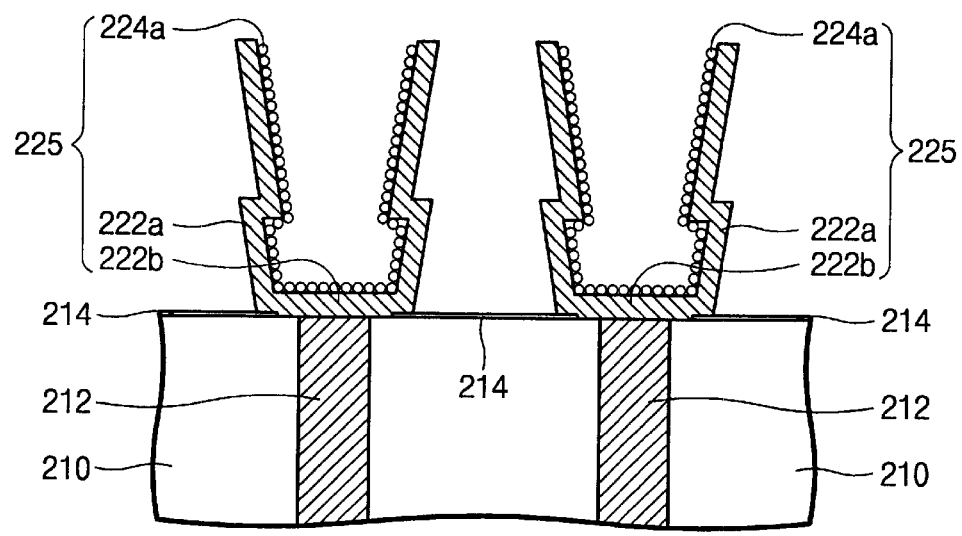

Referring to FIG. 2E, the sacrificial layer 226, the HSG silicon layer 224 and the conductive layer 222 are planarized until a top surface of the upper molding layer 218 is exposed to form cylindrical storage nodes 225 in the storage node holes 220a. Therefore, the storage nodes 225 each comprise a base 222b, a one-stepped sidewall 222a on the base 222b and a HSG silicon layer pattern 222a. If the process for forming the HSG silicon layer 224 is omitted, each of the storage nodes 225 comprises the base 222b and the one-stepped sidewall 222a.

The planarized sacrificial layer 226 may be left in the storage nodes 220a. The planarized sacrificial layer 226, the upper molding layer 218 and the lower molding layer 216 are then removed, using an oxide etchant such as a bufferd oxide etchant (BOE) or a HF solution, thereby exposing inner walls and outer walls of the storage nodes 220a. The interlayer insulating layer 210 can be protected with the etch stopping layer 214, during removal of the sacrificial layer patterns, the upper molding layer 218 and the lower molding layer 216.

As described above, the storage nodes have the one-stepped sidewall. Accordingly, surface area of each of the storage nodes is increased and, in turn, the cell capacitance is also increased.

Figure 3:
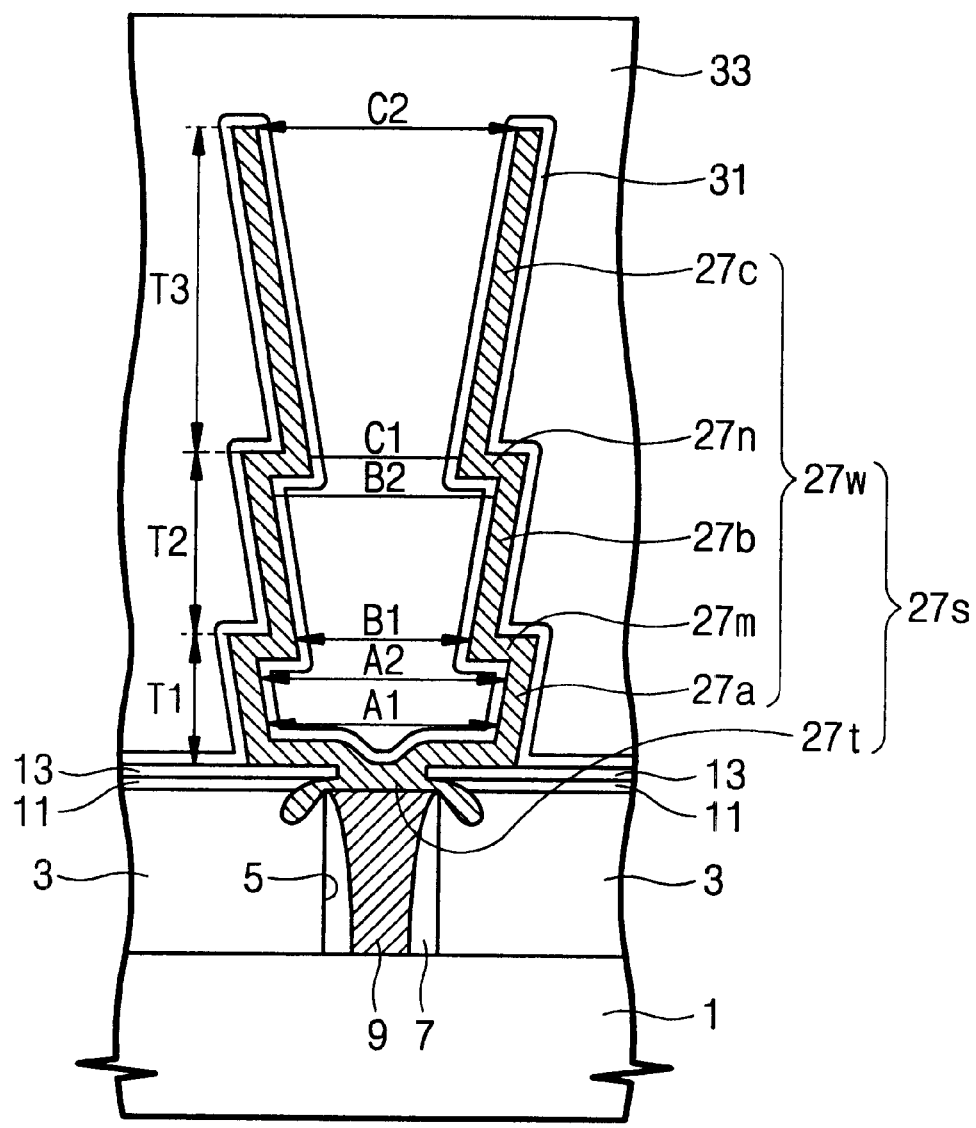
FIG. 3 is a cross sectional view that illustrates cylindrical capacitors according to another embodiment of the invention.

FIG. 3 is a cross-sectional view for illustrating a cylindrical capacitor according to another embodiment of the invention.

Referring to FIG. 3, an interlayer insulating layer 3 is disposed on a semiconductor substrate 1. A portion of the semiconductor substrate 1 is exposed by a storage node contact hole 5 formed within the interlayer insulating layer 3. The storage contact hole 5 is filled with a storage node contact plug 9. A spacer 7 may be formed on the sidewall of the storage node contact hole 5 next to the outer sidewall of the storage node contact plug 9. The interlayer insulating layer 3 and the storage node contact plug 9 may be covered with an etch stopping layer 13. In addition, a buffer oxide layer 11 such as a medium temperature oxide (MTO) layer may be formed under the etch stopping layer 13.

A cylindrical storage node 27s is formed on the storage node contact plug 9 and electrically connected thereto. The cylindrical storage node 27s comprises a base 27t and a cylinder-shaped lower electrode portion having a two-stepped sidewall 27w. The base 27t of the cylindrical storage node 27s is preferably extended into the buffer oxide layer 11 and the interlayer insulating layer 3, as shown in FIG. 3. The two-stepped sidewall 27w extends upwardly from the base 27t. Specifically, the lower portion of the two-stepped sidewall 27w is vertically aligned with or in direct contact with the edge of the base 27t. The base 27t is electrically connected to the storage node contact plug 9 through a hole that penetrates the etch stopping layer 13 and the buffer oxide layer 11.

In addition, the two-stepped sidewall 27w comprises a lower sidewall 27a, a middle sidewall 27b and an upper sidewall 27c that are sequentially stacked, a lower joint portion 27m that connects the lower sidewall 27a to the middle sidewall 27b, and an upper joint portion 27n that connects the middle sidewall 27b to the upper sidewall 27c. The joint portions 27n and 27m may have various shapes. For example, the joint portions 27n and 27m can have a shape of a circular ring when viewed from the top. An upper diameter of each of the lower sidewall, the middle sidewall and the upper sidewall is wider than a lower diameter thereof. For example, the first upper diameter A2 of the lower sidewall 27a is greater than the first lower diameter A1 thereof, and the second upper diameter B2 of the middle sidewall 27b is greater than the second lower diameter B1 thereof. Similarly, the third upper diameter C2 of the upper sidewall 27c is greater than the third lower diameter C1 thereof.

Furthermore, the first upper diameter A2 is greater than the second lower diameter B1, and the second upper diameter B2 is greater than the third lower diameter C1. Accordingly, an outer edge of the lower joint portion 27m is in contact with the upper portion of the lower sidewall 27a, and an inner edge of the lower joint portion 27m is in contact with the lower portion of the middle sidewall 27b. Also, an outer edge of the upper joint portion 27n is in contact with the upper portion of the middle sidewall 27b, and an inner edge of the upper joint portion 27n is in contact with the lower portion of the upper sidewall 27c. As a result, there is a first step between the lower sidewall 27a and the middle sidewall 27b, and there is a second step between the middle sidewall 27b and the upper sidewall 27c.

Moreover, it is preferable that a height T1 of the lower sidewall 27a be less than a height T2 of the middle sidewall 27b and a height T3 of the upper sidewall 27c be greater than the height T2 of the middle sidewall 27b.

The storage node 27s is covered with a dielectric layer 31 and the dielectric layer 31 is covered with a plate electrode 33.

Hereinafter, a fabrication method of the cylindrical capacitor shown in FIG. 3 will be described with reference to FIGS. 4A to 4F.

Figure 4A:
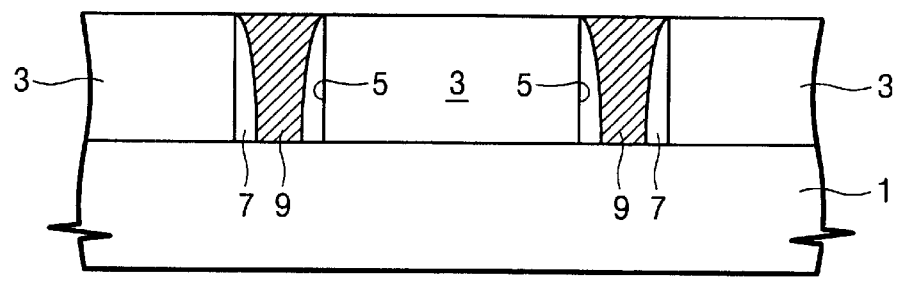
FIGS. 4A through 4F are cross sectional views that illustrate methods for fabricating cylindrical capacitors according to another embodiment of the invention.

Referring to FIG. 4A, an interlayer insulating layer 3 is formed on a semiconductor substrate 1. The interlayer insulating layer 3 is patterned to form a plurality of storage node contact holes 5 therein to expose predetermined regions of the semiconductor substrate 1. In addition, a spacer 7 may be formed on sidewalls of the storage node contact holes 5. The spacer 7 is preferably formed of a material that has an etch selectivity with respect to the material for the interlayer insulating layer 3. For example, if the interlayer insulating layer 3 is formed of silicon oxide, the spacer 7 can be formed of silicon nitride. Storage node contact plugs 9 are then formed in the storage node contact holes 5, using conventional techniques.

Figure 4B:
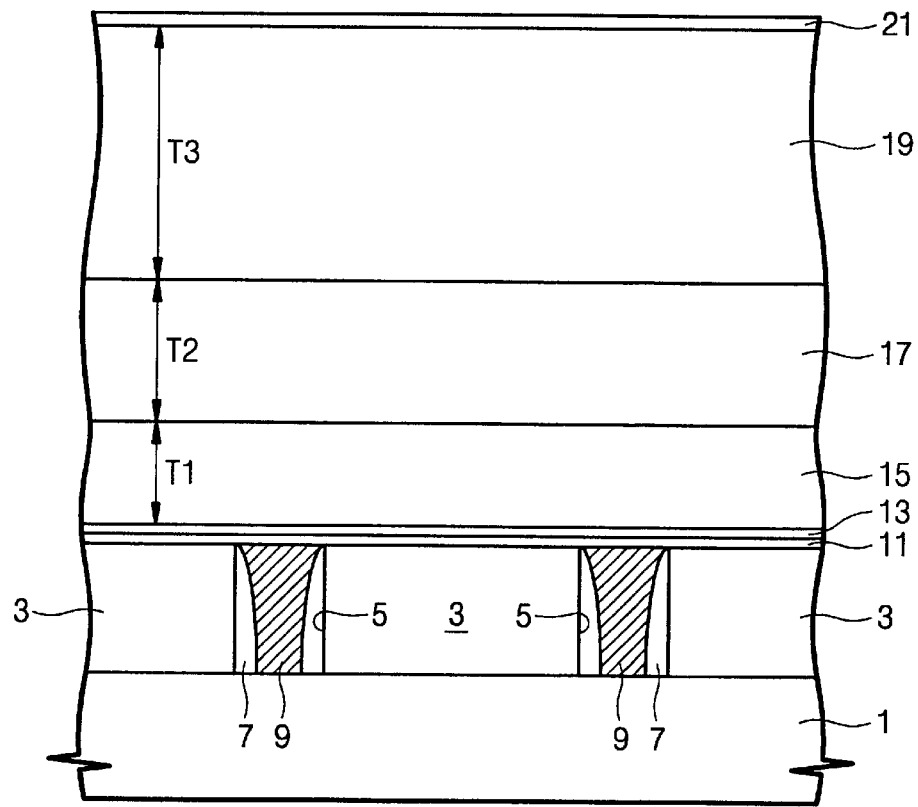

Referring to FIG. 4B, a lower molding layer 15, a middle molding layer 17 and an upper molding layer 19 are sequentially formed overlying the storage node contact plugs 9. Further, an etch stopping layer 13 may be formed on the substrate having the storage node contact plugs 9 before the formation of the lower molding layer 15. In addition, a buffer layer 11 may be formed on the substrate having the storage node contact plugs 9 before the formation of the etch stopping layer 13. The buffer layer 11 is preferably formed of the same material layer as the interlayer insulating layer 3. For example, the buffer layer 11 can be formed of oxide such as medium temperature oxide (MTO). The etch stopping layer 13 is preferably formed of a material that has an etch selectivity with respect to the material for the molding layers 15, 17 and 19. If the molding layers 15, 17 and 19 are formed of oxide, the etch stopping layer 13 is preferably formed of silicon nitride.

The lower molding layer 15 is preferably formed of a material that has an etch rate that is faster than that of the middle molding layer 17 with respect to a predetermined etchant. On the contrary, the upper molding layer 19 is preferably formed of another material that has an etch rate which is slower than that of the middle molding layer 17 with respect to the etchant. Specifically, the lower molding layer 15 and the middle molding layer 17 may be a first borophosphosilicate glass (BPSG) layer and a second BPSG layer, respectively, whereas the upper molding layer 19 may be an oxide layer that does not contain impurities such as boron and/or phosphorus. In such a case, the first and second BPSG layers can be formed so that the first BPSG layer has a higher etch rate than the second BPSG layer, by appropriately adjusting the boron concentration and/or the phosphorus concentration during the formation of the first and second BPSG layers. For example, if the lower molding layer 15 is a BPSG layer having a boron concentration of approximately 4w % and a phosphorus concentration of approximately 3.5w % and the middle molding layer 17 is another BPSG layer having a boron concentration of approximately 2.5w % and a phosphorus concentration of approximately 2.4 w %, the lower molding layer 15 exhibits an etch rate which is faster than that of the middle molding layer 17 with respect to an oxide etchant. Also, if the upper molding layer 19 is a plasma-TEOS layer, an undoped oxide layer or a HDP oxide layer, the upper molding layer 19 exhibits an etch rate which is slower than that of any BPSG layer with respect to the oxide etchant. Here, the oxide etchant may comprise a hydrofluoric acid (HF) solution or a buffered oxide etchant (BOE).

Further, an anti-reflective coating layer 21 may be formed on the upper molding layer 19 to suppress irregular reflection during a subsequent photolithography process. The anti-reflective coating layer 21 is preferably a silicon oxynitride (SiON) layer.

Figure 4C:
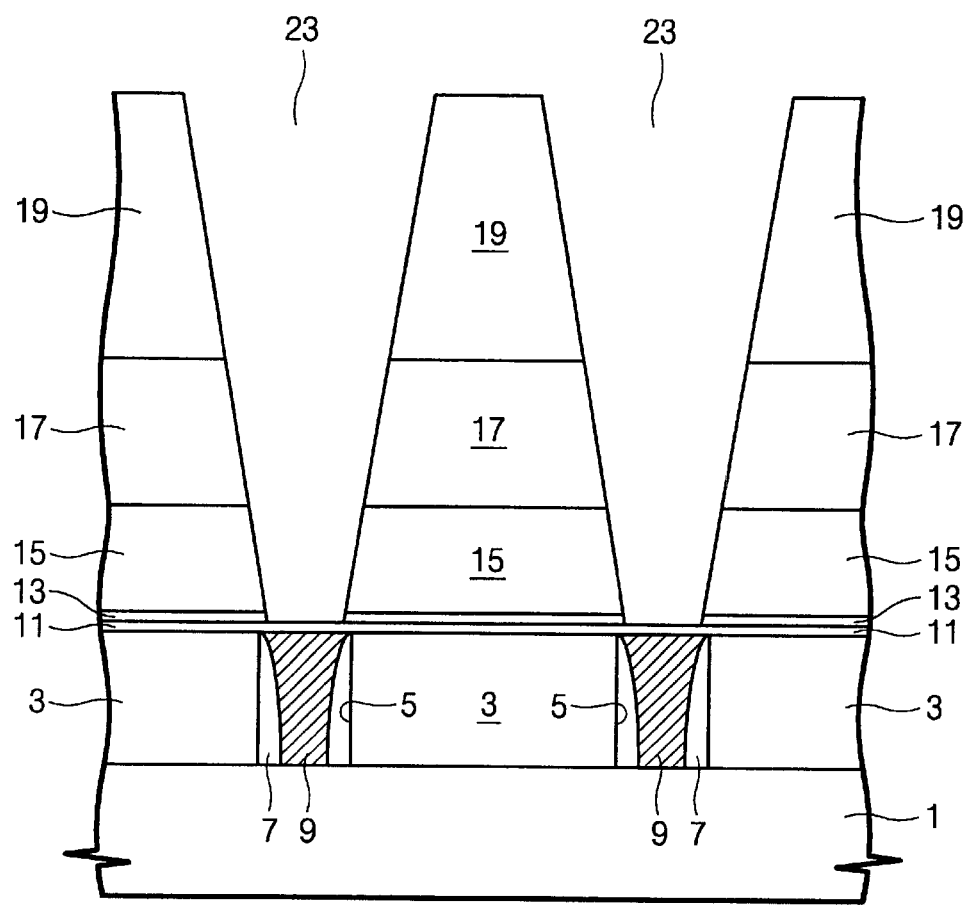

Referring to FIG. 4C, the anti-reflective coating layer 21, the upper molding layer 19, the middle molding layer 17 and the lower molding layer 15 are successively patterned using photolithography and etching processes, thereby forming a plurality of preliminary storage node holes 23 in the molding layers 15, 17 and 19. The etching process for forming the preliminary storage node holes 23 is preferably performed using an anisotropic etching technique such as a dry etching technique rather than a wet etching technique. In this case, however, the preliminary storage node holes 23 have positive sloped sidewalls. In other words, upper diameters of the preliminary storage node holes 23 are wider than lower diameters thereof. Accordingly, it is necessary to increase the bottom areas of the preliminary storage node holes 23 in order to obtain high performance capacitors.

Subsequently, the etch stopping layer 13 is etched to expose the storage node contact plugs 9. The patterned anti-reflective coating layer 21 is also removed while the etch stopping layer 13 is etched. If the buffer layer 11 is formed under the etch stopping layer 13, each of the preliminary storage node holes 23 exposes a predetermined region of the buffer layer 11, which is located on the respective storage node contact plugs 9, as shown in FIG. 4C.

Figure 4D:
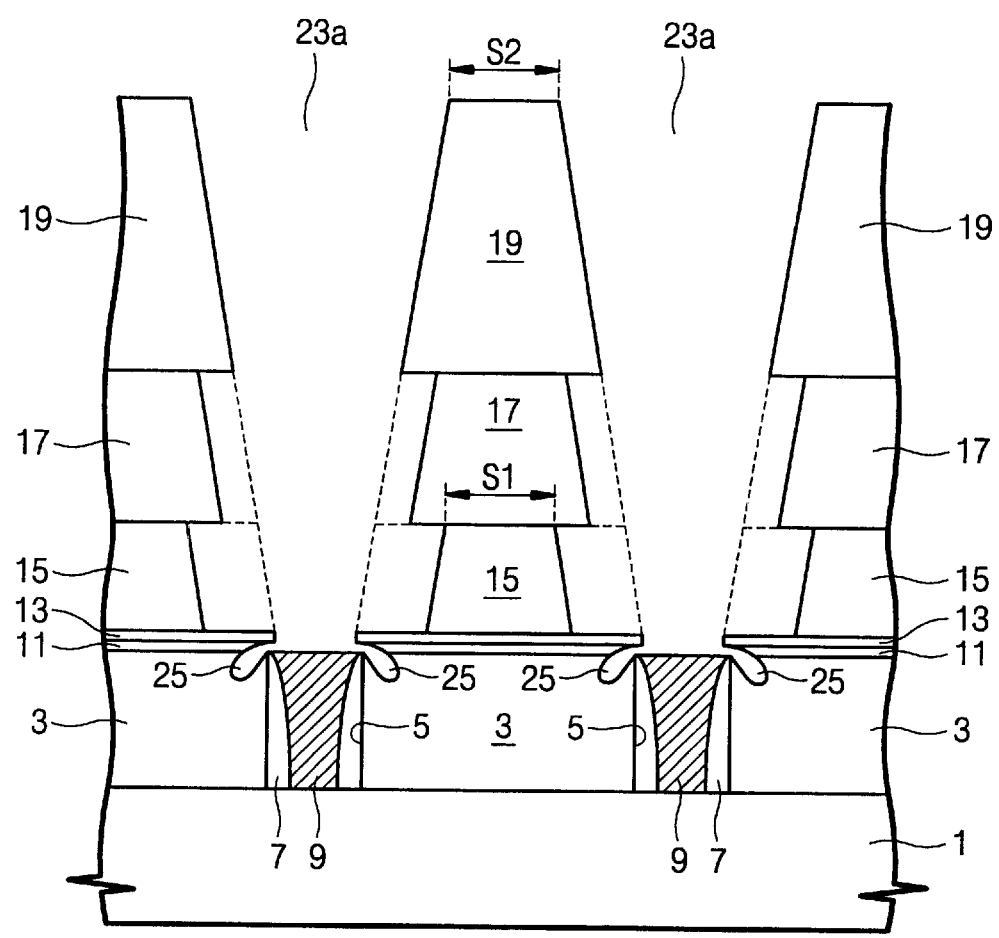

Referring to FIG. 4D, the molding layers 15, 17 and 19 are isotropically etched using the aforementioned oxide etchant, thereby forming a plurality of storage node holes 23a. Accordingly, the storage node holes 23a have stepped sidewalls due to the different etch rates of the molding layers 15, 17 and 19, as shown in FIG. 4D. In the event that the first thickness T1 of the lower molding layer 15 is greater than the second and third thickness T2 and T3 of the middle and upper molding layers 17 and 19, respectively, the lower distance S1 between the two adjacent storage node holes 23a may become more reduced as compared to the upper distance S2 therebetween. Thus, it is preferable that the first thickness T1 of the lower molding layer 15 be less than the second thickness T2 of the middle molding layer 17 and the third thickness T3 of the upper molding layer 19 be greater than the second thickness T2 of the middle molding layer 17, in order to prevent the two adjacent storage node holes 23a from being connected to each other.

In addition, a surface of the substrate having the storage node holes 23a may be treated using a pre-deposition cleaning solution such as a mixture of ammonium hydroxide ($NH_4OH$), hydrogen peroxide ($H_2O_2$) and de-ionized water. The mixture is widely used to remove native oxide and polymer.

The storage node holes 23a expose the respective storage node contact plugs 9, because the exposed buffer layer 11 can be also etched during formation of the storage node holes 23a. In this case, a void 25 may be formed at the periphery of the respective storage node contact plugs 9. This void 25 may prevent a storage node, which is formed in a subsequent process, from being lifted.

Figure 4E:
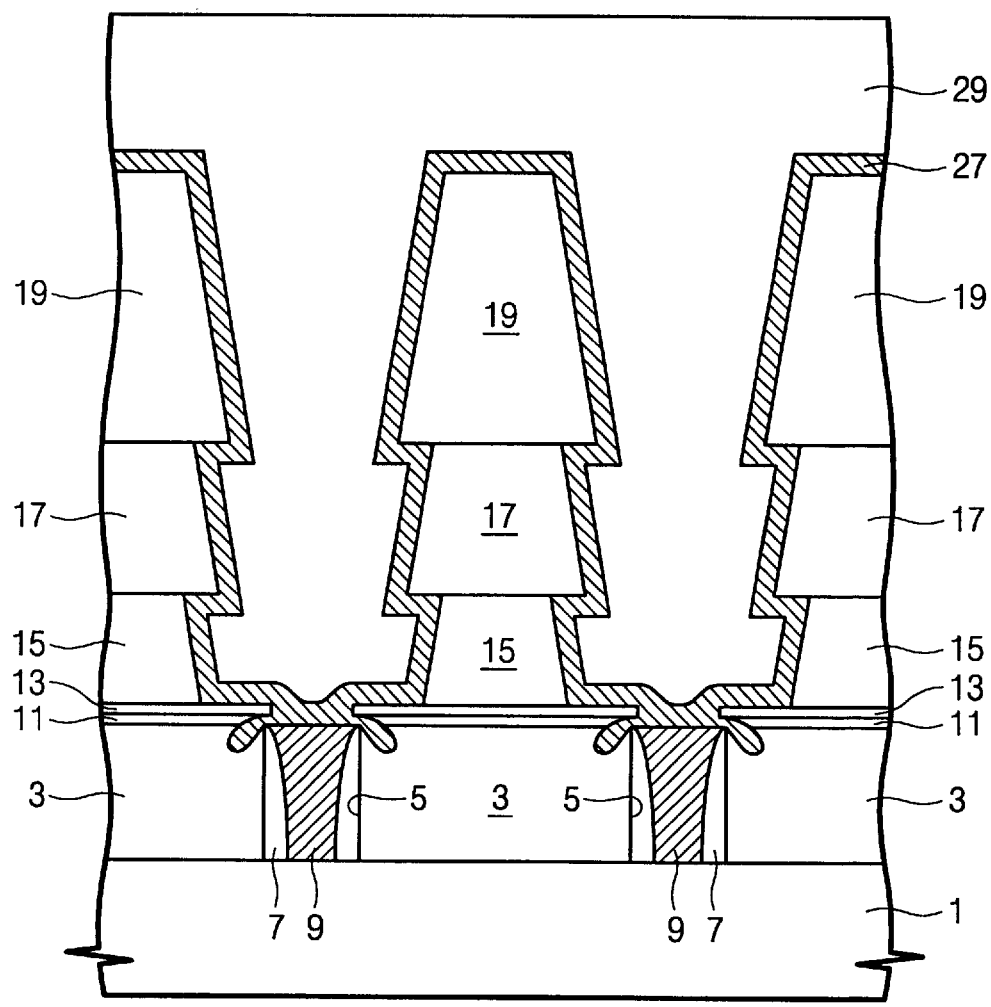

Referring to FIG. 4E, a conformal conductive layer 27 is formed within the storage node holes 23a. The conductive layer 27 may be a doped polysilicon layer or a doped amorphous silicon layer. In this case, the void 25 (see FIG. 4D) is filled with the conductive layer 27. A sacrificial layer 29 is then formed on the conductive layer 27. The sacrificial layer 29 is preferably a silicon oxide layer. Also, the sacrificial layer 29 is preferably formed to fill the storage node holes 23a, next to the conductive layer 27. Though not shown in the figure, a hemispherical grain (HSG) silicon layer can be formed on the conductive layer 27, as described in the first embodiment.

Figure 4F:
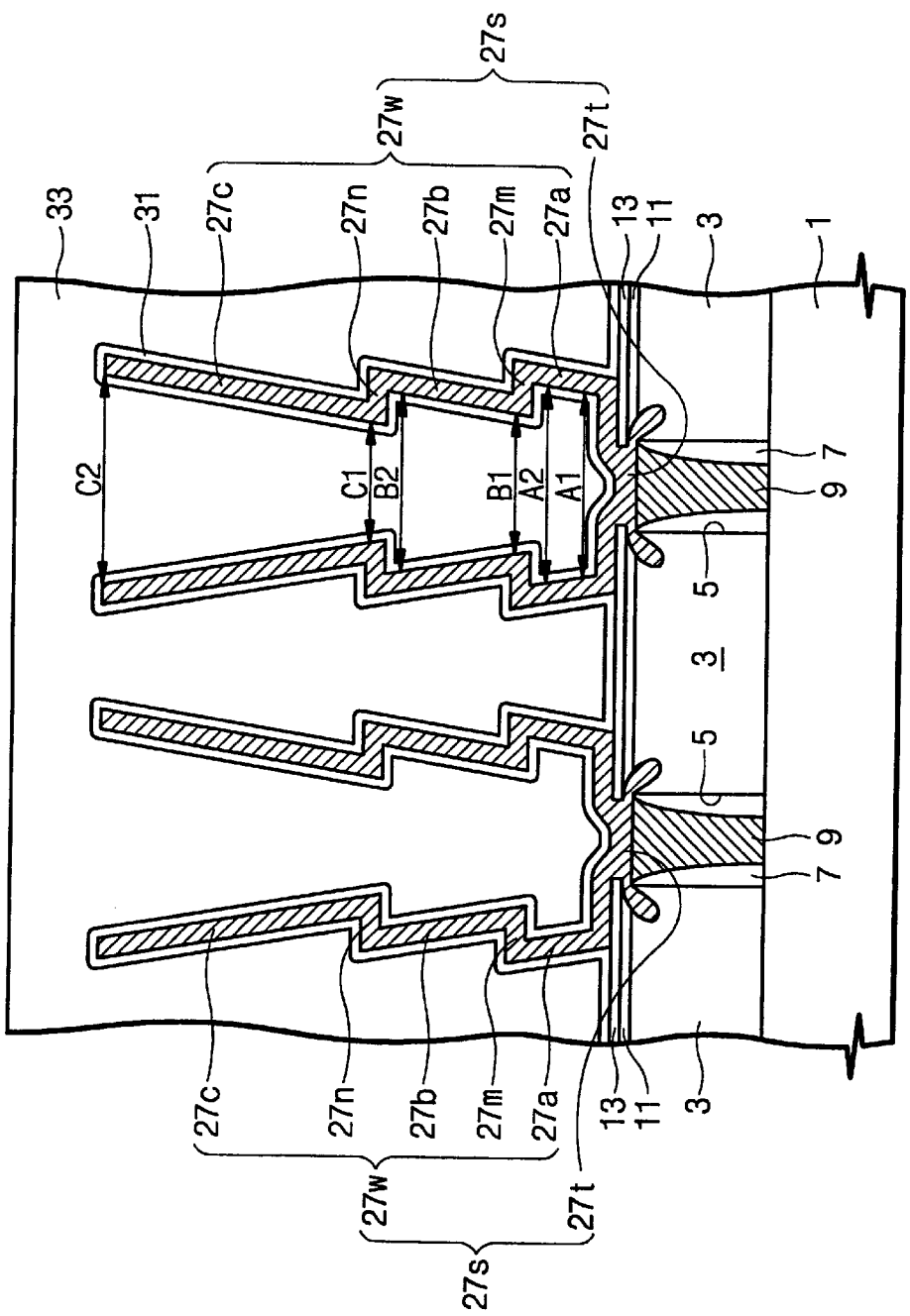

Referring to FIG. 4F, the sacrificial layer 29 and the conductive layer 27 are planarized until the top surface of the upper molding layer 19 is exposed. The planarization process is preferably performed using a chemical mechanical polishing (CMP) technique. As a result, cylindrical storage nodes 27s are formed in the storage node holes 23a, and patterned sacrificial layer 29 may be left in the storage nodes 27s. Each of the storage nodes 27s comprises a base 27t and a cylinder-shaped lower electrode portion having a two-stepped sidewall 27w.

The base 27t is electrically connected to the storage contact plug 9 through a hole extending through the etch stopping layer 13 and the buffer layer 11. The two-stepped sidewall 27w has a lower sidewall 27a, a middle sidewall 27b and an upper sidewall 27c, which are sequentially stacked. In addition, the two-stepped sidewall 27w has a lower joint portion 27m and an upper joint portion 27n. The joint portions 27m and 27n may have various shapes. For example, the joint portions 27m and 27n define a circular-shaped ring when viewed from a top view. The lower joint portion 27m connects the lower sidewall 27a to the middle sidewall 27b, and the upper joint portion 27n connects the middle sidewall 27b to the upper sidewall 27c. Here, a first upper diameter A2 of the lower sidewall 27a is wider than a first lower diameter A1 thereof, and a second upper diameter B2 of the middle sidewall 27b is wider than a second lower diameter B1 thereof. Similarly, a third upper diameter C2 of the upper sidewall 27c is wider than a third lower diameter C1 thereof. Accordingly, an outer edge of the lower joint portion 27m is in contact with an upper region of the lower sidewall 27a, and an inner edge of the lower joint portion 27m is in contact with a lower region of the middle sidewall 27b. Similarly, an outer edge of the upper joint portion 27n is in contact with an upper region of the middle sidewall 27b, and an inner edge of the upper joint portion 27n is in contact with a lower region of the upper sidewall 27c. As a result, a first step is formed between the lower sidewall 27a and the middle sidewall 27b, and a second step is formed between the middle sidewall 27b and the upper sidewall 27c.

Subsequently, the molding layers 15, 17 and 19 are removed using a wet etchant such as the oxide etchant, thereby exposing the etch stopping layer 13. In this case, the patterned sacrificial layer 29 in the storage nodes 27s may be also removed during removal of the molding layers 15, 17 and 19. Accordingly, inner walls and outer walls of the storage nodes 27s are all exposed. At this time, the buffer layer 11 and the interlayer insulating layer 3 may not be etched. This is due to the presence of the etch stopping layer 13 on the buffer layer 11 or the interlayer insulating layer 3.

Next, a dielectric layer 31 and a plate electrode 33 are sequentially formed on the storage node 27s.

According to the invention as described above, the surface areas of the cylindrical storage nodes are maximized due to the stepped sidewalls. Therefore, it is possible to realize high performance cylindrical capacitors.

What is claimed is:

1. A cylindrical capacitor comprising:

a semiconductor substrate; and a cylindrical storage node formed over the semiconductor substrate, wherein the storage node has a base and a cylinder-shaped lower electrode portion having a two-stepped sidewall extending upwardly from the base, wherein the two-stepped sidewall has a lower sidewall, a middle sidewall and an upper sidewall that are sequentially stacked, a lower joint portion that connects the lower sidewall to the middle sidewall, and an upper join portion that connects the middle sidewall to the upper sidewall, wherein an upper diameter of each of the lower sidewall, the middle sidewall and the upper sidewall is greater than a lower diameter thereof, wherein the upper diameter of the lower sidewall is greater than the lower diameter of the middle sidewall, and the upper diameter of the middle sidewall is greater than the lower diameter of the upper sidewall, and wherein a height of the lower sidewall is less than that of the middle sidewall, and a height of the middle sidewall is less than that of the upper sidewall.

2. The cylindrical capacitor according to claim 1 further comprising:
    an interlayer insulating layer interposed between the storage node and the semiconductor substrate; and
    a storage node contact plug formed within the interlayer insulating layer, the storage node contact plug electrically connecting the storage node to the semiconductor substrate.

3. The cylindrical capacitor according to claim 1 further comprising:
    a capacitor dielectric layer formed on the storage node; and
    a plate electrode stacked on the capacitor dielectric layer.

* * * * *